(12) United States Patent
Ales et al.

(10) Patent No.: US 7,524,195 B2
(45) Date of Patent: Apr. 28, 2009

(54) CONDUCTIVE HOOK AND LOOP PRINTED CIRCUIT BOARD ATTACHMENT

(75) Inventors: Thomas Michael Ales, Neenah, WI (US); Davis-Dang Hoang Nhan, Appleton, WI (US)

(73) Assignee: Kimberly-Clark Worldwide, Inc., Neenah, WI (US)

( * ) Notice: Subject to any disclaimer, the term of this patent is extended or adjusted under 35 U.S.C. 154(b) by 13 days.

(21) Appl. No.: 11/740,671

(22) Filed: Apr. 26, 2007

(65) Prior Publication Data
US 2008/0268663 A1 Oct. 30, 2008

(51) Int. Cl.
*H01R 12/00* (2006.01)
(52) U.S. Cl. .......................................................... 439/66
(58) Field of Classification Search ..................... 439/66
See application file for complete search history.

(56) References Cited

U.S. PATENT DOCUMENTS

| 4,415,025 | A | 11/1983 | Horvath |
| 7,354,276 | B2 * | 4/2008 | Dittmann ..................... 439/66 |

FOREIGN PATENT DOCUMENTS

JP    9-130050    5/1997

* cited by examiner

*Primary Examiner*—Truc T Nguyen
(74) *Attorney, Agent, or Firm*—Armstrong Teasdale LLP

(57) ABSTRACT

The present disclosure is directed to conductive connector attachments for use in electrically connecting printed circuit boards to absorbent products such as diapers, training pants, incontinence products, feminine hygiene products, and the like. Specifically, various configurations and methods of securely attaching conventional conductive hook and loop attachments to printed circuit boards are disclosed.

4 Claims, 10 Drawing Sheets

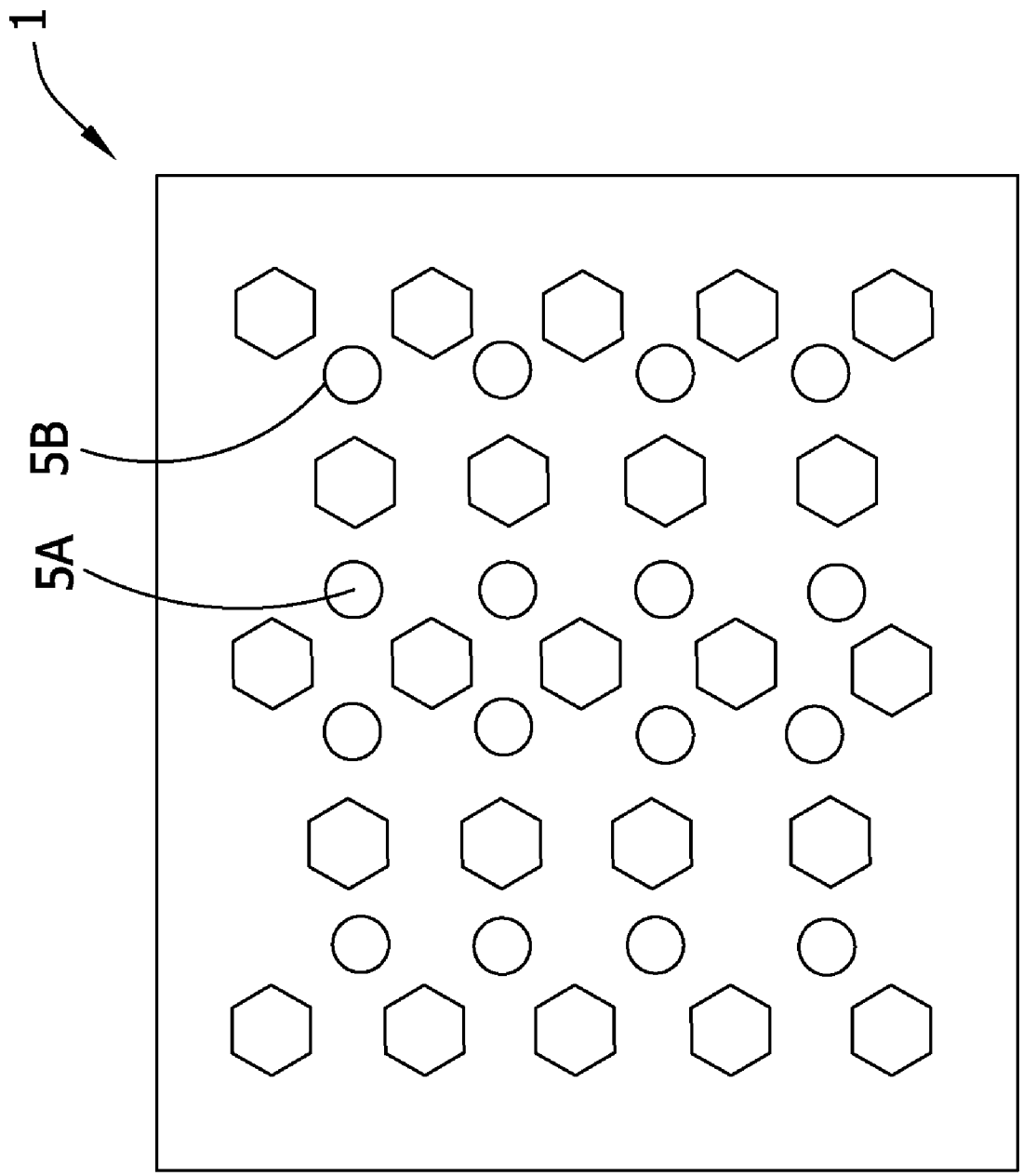

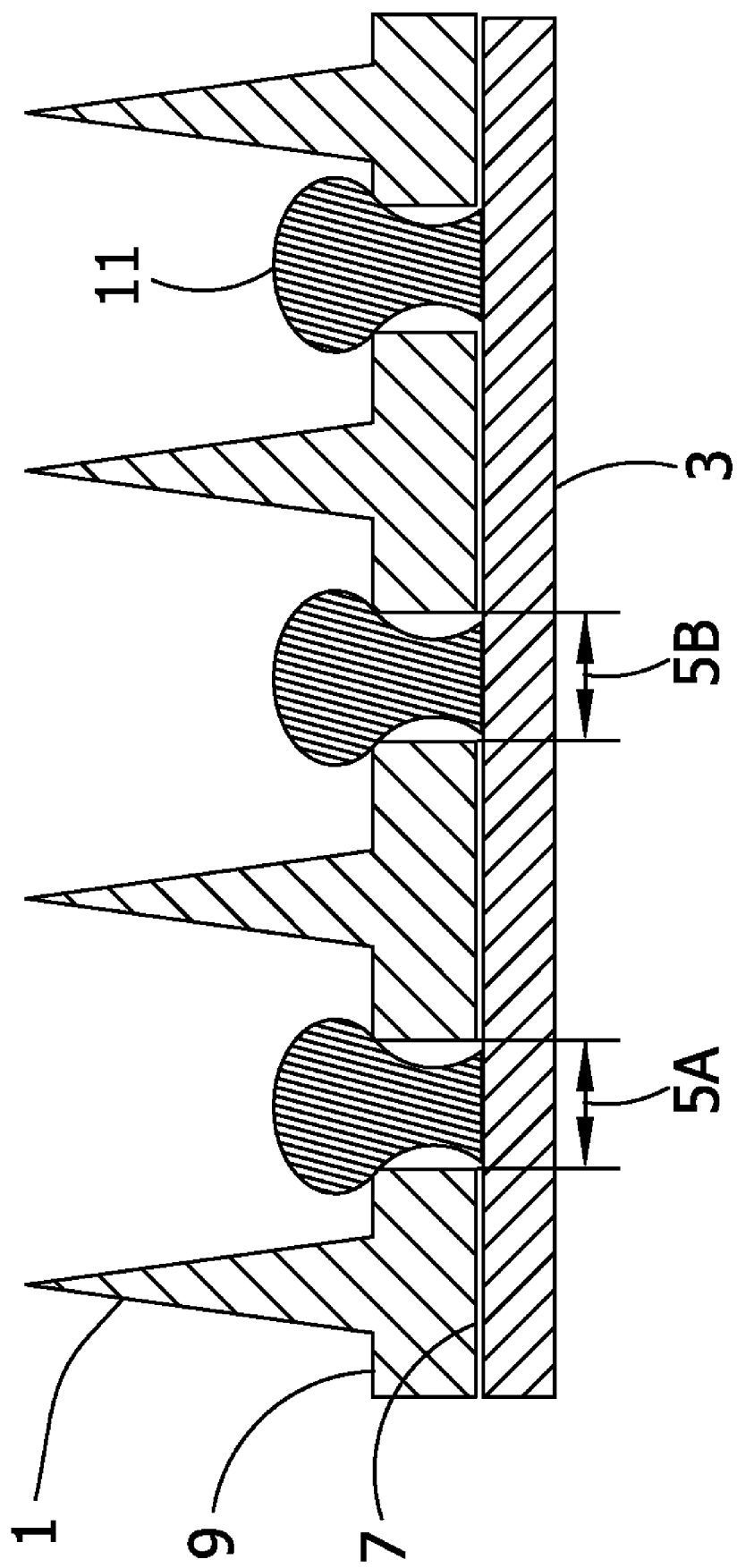

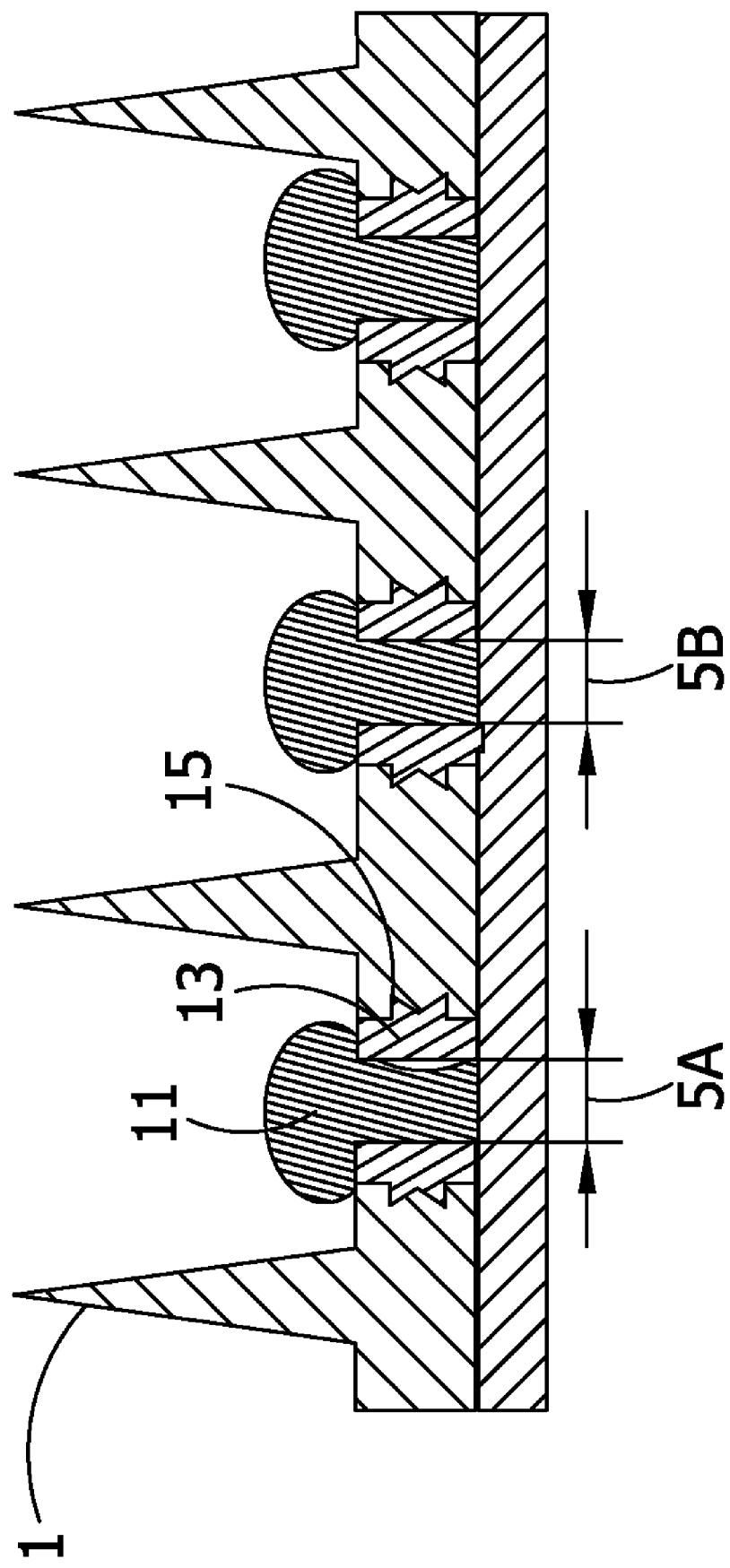

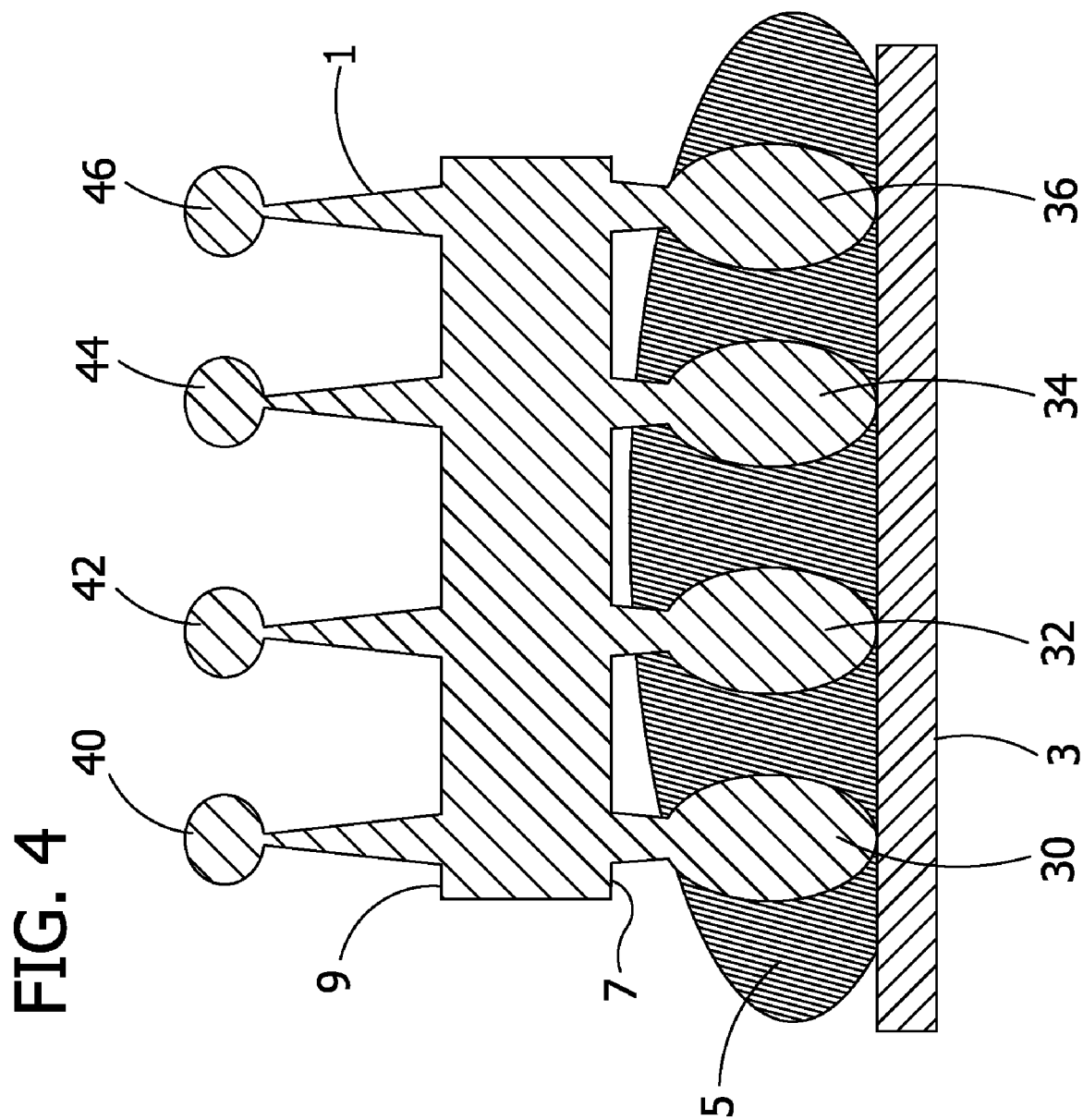

CONDUCTIVE HOOK AND LOOP PRINTED CIRCUIT BOARD ATTACHMENT

BACKGROUND OF DISCLOSURE

The present disclosure generally relates to conductive connector attachments for printed circuit boards. More specifically, the present disclosure is directed to conductive hook and loop attachments for printed circuit boards.

Current consumer electronic assembly is dominated with metal conduits and connections due to their high reliability, reasonable cost, and excellent electrical characteristics. Conventionally, printed circuit boards have been connected to integrated circuit semiconductor chips and the like using some type of intermediate device carrier. One such type of interconnection mounts the integrated circuit chip on a circuit chip carrier or module, which module in turn is mounted onto the circuit board. In a particularly well known type of interconnection mount, the integrated circuit chip is mounted onto a ceramic module by "flip-chip" bonding wherein the I/O pads on the face of the chip are bonded to corresponding pads on the module, such connection being formed by use of solder bumps or solder balls normally using solder reflow techniques. Such connections are often referred to as C4 connections. The ceramic module conventionally has a wiring structure either on the surface thereof or more usually on the surface and also buried therein which fans out, and vias formed of conducting material pass through the module terminating on the opposite side thereof. Conventionally, the opposite side of the module is provided with an array of pins, which pins in turn are positioned to be inserted into a complementary array of holes on a circuit board. This type of mounting of a module to a board is commonly known as "pin-in-hole" mounting. Mounting of a chip to module or module to board by these types of connections is well known in the art and further, is shown in U.S. Pat. No. 4,415,025, assigned to IBM.

Recently, however, consumer electronics have spread into non-traditional product categories such as consumer products and textiles. For example, various types of electronic moisture or wetness indicators have been suggested for use in disposable absorbent articles such as diapers. The wetness indicators may include alarm devices that are designed to assist parents or attendants in identifying a wet diaper condition early on. The indicator devices typically produce either a visual or an audible signal.

Problems, however, have been encountered in designing an attachment mechanism for the signaling device that allows for a very reliable attachment of the signaling device to the conductive leads while not appreciably increasing the cost of the absorbent article. For example, currently machined metal connectors are required for the alarm signals in absorbent articles to penetrate the liner materials and engage in the underlying foils. These metal conductors, being specially created for this task, are inherently low volume and are considered a premium.

Furthermore, while alternatives to metal connectors, such as conventional conductive plastics and conductive threads, are known, these materials have been unable to attach the devices to the articles satisfactorily. Specifically, many times the connection resistance of a proximal connection between a connector and a conductive path on the fabric will produce areas where the connector attachment buckles away from the underlying conductive patch, thereby varying the surface area of contact and varying the resistance of the connection. Furthermore, the affinity of solder materials typically used in attaching these types of connectors to printed circuit boards is low and, as such, when attempting to directly solder a patch of a connector onto a printed circuit board, a cold solder joint is formed which results in the thermoplastic material of the connector cracking away from the solder material, producing an unsatisfactory bond.

As such, there is a need in the art for a conductive connector attachment for use in consumer products and textiles capable of securely attaching to a printed circuit board, while providing good electrical connection. Additionally, it would be advantageous if the conductive connector attachment was low in cost and could be produced in high volume.

SUMMARY OF THE DISCLOSURE

The present disclosure generally relates to conductive connector attachments for use in electrically connecting printed circuit boards to consumer absorbent products and textiles such as diapers, training pants, incontinence products, feminine hygiene products, and the like. Specifically, in one example, one half of a conductive hook and loop attachment can be connected to a printed circuit board, and the second half can then be attached to the chassis of a diaper.

The hook and loop attachments can be any conventional hook and loop attachment known in the art and, as such, can be produced relatively cheaply and in high volume. Furthermore, the attachment configurations disclosed in the present disclosure provide good electrical conductivity and a sufficiently secured mechanical attachment to a printed circuit board.

As such, the present disclosure is directed to a conductive connector attachment for a printed circuit board. The conductive connector attachment comprises a conductive hook material, a printed circuit board, a solder material, and a conductive loop material. The conductive hook material comprises a contact side, an opposing non-contact side, and at least one hole that continues from the non-contact side to the contact side. The contact side comprises multiple hooks. The hole in the conductive hook material is filled with the solder material thereby electrically connecting the printed circuit board to the non-contact side of the conductive hook material. Furthermore, the conductive loop material is compatible with the contact side of the conductive hook material and, as such, can be securely fastened thereto.

The present disclosure is further directed to a conductive connector attachment for a printed circuit board. The conductive connector attachment comprises a conductive hook material, a printed circuit board, and a conductive loop material. The conductive hook material comprises a contact side and an opposing non-contact side. The contact side comprises multiple hooks. The non-contact side comprises at least one stud. The printed circuit board comprises at least one via, wherein the stud of the conductive hook material is compatible with the via and can be fitted into the via, thereby electrically connecting the printed circuit board to the non-contact side of the conductive hook material. In one embodiment, a solder material can be applied to the stud material, allowing for an even stronger connection between the printed circuit board and the conductive hook material. Furthermore, the conductive loop material is compatible with the contact side of the conductive hook material and, as such, can be securely fastened thereto.

The present disclosure is further directed to a conductive connector attachment for a printed circuit board. The conductive connector attachment comprises a conductive hook material comprising a contact side and an opposing non-contact side, a printed circuit board, a metal scrim layer located between the non-contact side of the conductive hook material and the printed circuit board, a solder material, and a conductive loop material. The contact side of the conductive hook material comprises multiple hooks. The solder material electrically connects the metal scrim layer to each of the non-contact side of the conductive hook material and the printed circuit board. Furthermore, the conductive loop material is compatible with the contact side of the conductive hook material and, as such, can be securely fastened thereto.

The present disclosure is further directed to a conductive connector attachment for a printed circuit board. The conductive connector attachment comprises a conductive hook material, a printed circuit board, a solder material, and a conductive loop material. The conductive hook material comprises a contact side and an opposing non-contact side. Both of the contact side and non-contact side comprise multiple hooks. The solder material electrically connects the hooks of the non-contact side of the conductive hook material to the printed circuit board. Furthermore, the conductive loop material is compatible with the contact side of the conductive hook material and, as such can be securely fastened thereto.

Other objects and features will be in part apparent and in part pointed out hereinafter.

BRIEF DESCRIPTION OF THE DRAWINGS

FIG. 1A depicts a top view of one configuration for the conductive connector attachment of the present disclosure.

FIG. 1B depicts a side view of the configuration for the conductive connector attachment shown in FIG. 1A.

FIG. 2A depicts a side view of a second configuration for the conductive connector attachment of the present disclosure.

FIG. 4 depicts a side view of a fourth configuration for the conductive connector attachment of the present disclosure.

Corresponding reference characters indicate corresponding parts throughout the drawings.

DETAILED DESCRIPTION OF THE DISCLOSURE

Figure 2B:
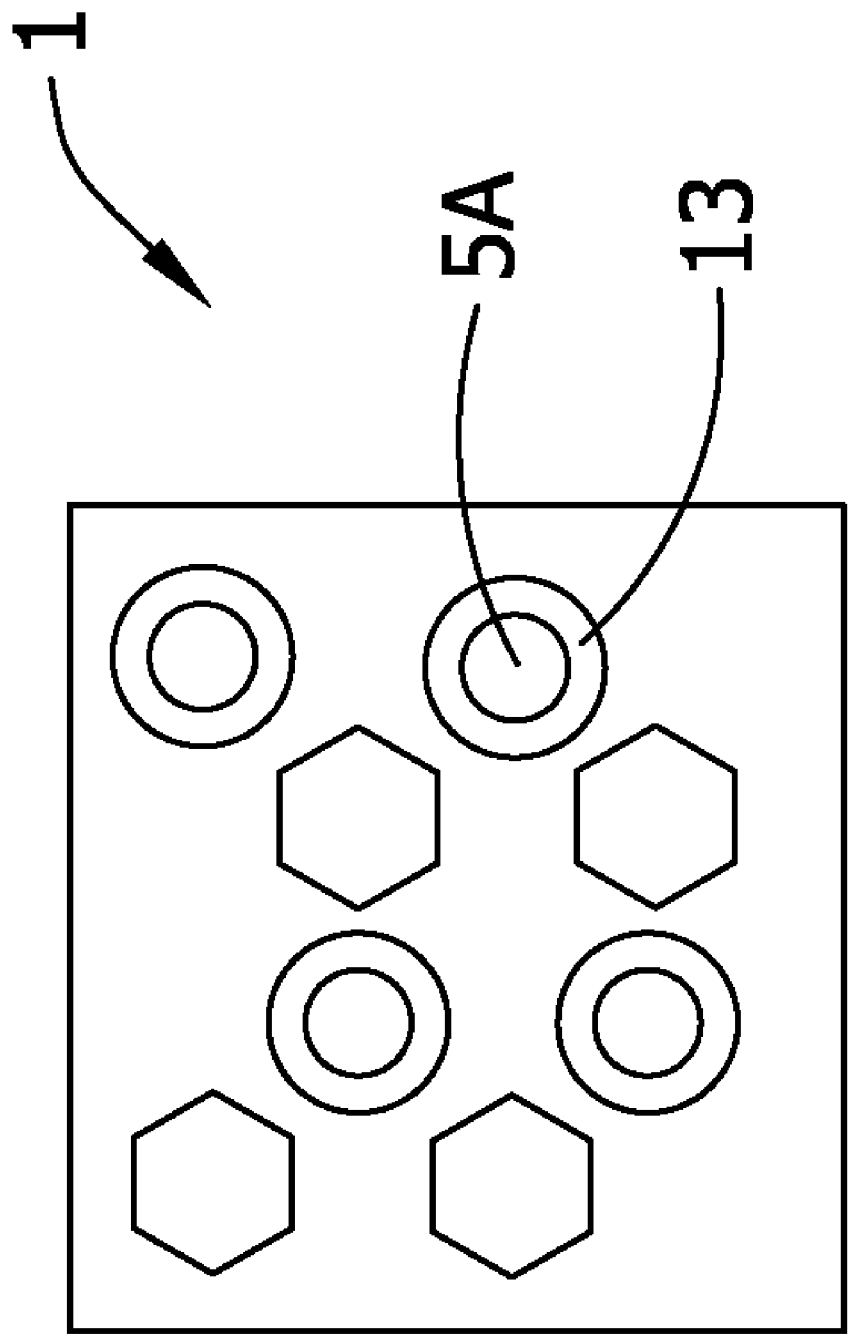
FIG. 2B depicts a top view of the configuration for the conductive connector attachment shown in FIG. 2A.

The present disclosure is directed to conductive connector attachments for use in electrically connecting printed circuit boards to absorbent products such as diapers, training pants, incontinence products, feminine hygiene products, and the like. Specifically, the inventors have discovered various configurations and methods of securely attaching conventional conductive hook and loop attachments to printed circuit boards to produce conductive connector attachments having good electrical conductivity.

As noted above, the conductive connector attachments include conductive hook and loop materials and a printed circuit board. The conductive hook material for use in the conductive connector attachment of the present disclosure generally comprises a conductive thermoplastic material. Suitable thermoplastic materials can include materials such as polyolefins, nylon, styrene block copolymers, and combinations thereof. In a particularly preferred embodiment, the hook material is made from polypropylene, polyethylene, or a combination thereof. In an alternative preferred embodiment, the hook material is made from styrene-butadiene-styrene block copolymer.

The hook material may be made conductive, for instance, by incorporating a conductive material such as carbon fibers, carbon black particles, metallic fibers, and metal coated fibers into the thermoplastic fibers of the material. In another embodiment, the hook material may be made from conductive threads.

Alternatively, in one particularly preferred embodiment, the hook material is made conductive by coating the hook material with a conductive material, such as by vapor depositing a metal on the surface of the hook material. Specifically, the conductive hook material may be vapor deposited with a metal selected from the group consisting of aluminum, copper, iron, silver, gold, nickel, zinc, tin, and combinations thereof. In one particularly preferred embodiment, the conductive hook material is produced by vapor depositing aluminum onto the surface of the hook material. Typically, to produce a sufficiently conductive hook material, the metal is vapor deposited onto the surface of the conductive hook material in a thickness of from about 20 angstroms to about 800 angstroms. More suitably, the metal is vapor deposited onto the surface of the conductive hook material in a thickness ranging of from about 100 angstroms to about 400 angstroms and, even more suitably, a thickness of from about 140 angstroms to about 275 angstroms.

Commercially available conductive hook material are available as conductive VELCRO hook fasteners (available from Velcro USA, Inc., Manchester, N.H.).

Generally the conductive hook material comprises a contact side that is compatible with its mating part, a conductive loop material. The contact side of the conductive hook material comprises multiple hooks, which engage in the loops present on the surface of the conductive loop material. To provide a sufficiently secure attachment from the hook material to the loop material, the hooks on the contact side of the conductive hook material are suitably from about 1 micron to about 5 millimeters in length. More suitably, the hooks are about 1 micron to about 1 millimeter in length.

The conductive hook material further comprises an opposing side from the contact side, termed the non-contact side, which will face away from the conductive loop material. The non-contact side can be a smooth surface, can comprise one or more studs, or can comprise multiple hooks similar to the contact side, as discussed more fully below, which will contact a signaling device such as the printed circuit board of the present disclosure.

The conductive loop material is suitably formed of similar thermoplastic material as the conductive hook material. Moreover, the loop material can be made conductive using similar means as described above for the conductive hook material. In one particularly preferred embodiment, the conductive loop material is produced by vapor depositing a conductive metal to the surface of the loop material.

Similar to the conductive hook material, the conductive loop material comprises multiple loops, ranging from about 1 micron to about 5 millimeters in length. More suitably, the loops are from about 1 micron to about 1 millimeter in length.

In general, the sizes of the conductive hook material and conductive loop material may vary depending upon the desired application. The materials, for example, may have any size sufficient to facilitate an electrical connection with a corresponding signaling device such as the printed circuit board. Suitable sizes of the conductive hook material and conductive loop material include, for example, a surface area of at least about 0.5 cm². More suitably, the conductive hook material and conductive loop material have a surface area of at least about 1 cm², even more suitably, at least about 2 cm² and, even more suitably, at least about 3 cm². Suitable conductive hook and loop materials are the type commercially available under the Trademark VELCRO (available from Velcro USA, Inc., Manchester, N.H.).

The conductive hook material and conductive loop material are each configured to electrically connect to a signal device. Specifically, in one embodiment, the conductive hook material is electrically connected to a printed circuit board. The printed circuit board of the present disclosure can be any printed circuit board known in the art suitable for use in consumer absorbent products or textiles. For example, in one embodiment, the printed circuit board is a multi-layer printed circuit board made by a method disclosed by, for example, Japanese Patent Laid Open No. 9-130050. Generally, a rough layer is formed on the surface of the conductor circuit of a printed circuit board by electroless painting or etching. Then, an interlayer insulating resin is applied, exposed and developed by a roll coater or printing, via hole and opening portions are formed for making layers continuous, and an interlayer resin insulting layer is formed through UV hardening, actual hardening, and the like. Further, a catalyst such as palladium is applied onto the interlayer resin insulting layer on the rough surface which has been subjected to a roughing process with an acid or an oxidizer. A thin electroless plated film is formed, a pattern is formed on the plated film by a dry film and the thickness of the pattern is increased by electroplating. Thereafter, the dry film is separated and removed by an alkali and etched to thereby form a conductor circuit. By repeating the above processes, a buildup multi-layer printed circuit board is obtained.

Typically, the printed circuit board of the present disclosure has a thickness ranging from about 5 millimeter to about 125 millimeters. More suitably, the printed circuit board has a thickness of from about 20 millimeters to about 100 millimeters and, even more suitably, from about 30 millimeters to about 65 millimeters.

When attaching the printed circuit board to the conductive hook material (or conductive loop material), mechanical and electrical connection typically occurs on the printed circuit board at sites referred to as solder pads. The solder pads can range is size depending on the desired application. Suitable ranges for the size of the solder pads are from less than about 1 mm×1 mm to about 3 mm×7 mm. Typically, the size of the solder pad should match the electrical component being used for a complete electrical and mechanical connection. One particularly suitable size for the solder pad can be, for example, a 3 mm×7 mm area.

According to the present disclosure, one or more components of the conductive connector attachment is configured to electrically connect either the conductive hook material or the conductive loop material to the printed circuit board using either compression fit or soldering mechanisms. For example in one embodiment, as shown in FIGS. 1A and 1B, the conductive hook material 1 is configured to connect to the printed circuit board 3 using conventional soldering mechanisms. Specifically, in this embodiment, the conductive hook material 1 comprises at least one hole 5A, more suitably multiple holes 5A, 5B, that continues from the non-contact side 7 to the contact side 9 of the conductive hook material 1. Typically, the hole can be of any shape that can fit between the hooks on the contact side of the conductive hook material. Suitable shapes can include, for example, circles, ovals, squares, rectangles, triangles, and combinations thereof.

The size of the holes, number of holes and spacing between holes within the conductive hook material will depend on the desired end product. Typically, however, it is suitable to produce a conductive hook material having a greater number of holes, each having a smaller diameter to reduce any solder material (when used) from flowing through in large amounts and interfering with the electrical and physical connections of the hook material, while having a large enough diameter to allow enough solder material through to create a sufficient mechanical bond. Furthermore, by using smaller diameter-holes, a capillary action effect can be produced, thereby allowing for a better wicking action of the solder material up through the hole.

As noted above, a suitable solder material 11 is wicked through the holes 5A, 5B of the conductive hook material 1, thereby connecting the printed circuit board 3 to the conductive hook material 1. Specifically, the non-contact side 7 of the conductive hook material 1 is directly connected to the printed circuit board 3.

Generally, soldering with a suitable solder material will melt the thermoplastic hook material. Once removed from the molten solder material, the solder material will solidify and adhere around the thermoplastic hook material. One advantage of the thermoplastic materials used in the conductive hook material (and conductive loop material) of the present disclosure is that the thermoplastic materials have a low melting point and thus, can easily be melted with conventional soldering mechanisms using lower temperatures. Furthermore, by using hook and loop material-type fasteners, more electrical and mechanical connection points are created as compared to fasteners conventionally used with soldering printed circuit boards.

Suitable solder materials can include, but are not limited to, for example, lead/tin alloys, lead-free tin alloys, tin/silver alloys, tin/silver/copper alloys, and tin/silver/copper/antimony alloys. In one particularly preferred embodiment, the solder material is a solder paste part placement. For example, the solder paste contains particles of lead/tin alloy suspended in a gel, which are applied in a wet state to the conductive hook material and printed circuit board. Once heat is applied, the non-conductive gel melts away and the solder material melts and bonds the connection points of the conductive hook material and the solder pads of the printed circuit board.

In one particularly preferred embodiment, as shown in FIGS. 2A and 2B, the holes 5A, 5B in the conductive hook material 1 are conductive throughholes comprising a metal 13 to produce a more robust electrical connection. Suitable metals for use in the conductive throughholes can include, for example, aluminum, copper, iron, silver, gold, nickel, zinc, tine, and combinations thereof.

Suitably, the conductive throughholes can further include teeth 15 that connect to the internal sides of the conductive hook material. The teeth 15 provide for a more secure connection as the teeth grip into the internal sides of the conductive hook material forming a stronger mechanical bond. Furthermore, the teeth provide a larger connecting surface area and, thus a better electrical connection to the conductive hook material.

Figure 3A:
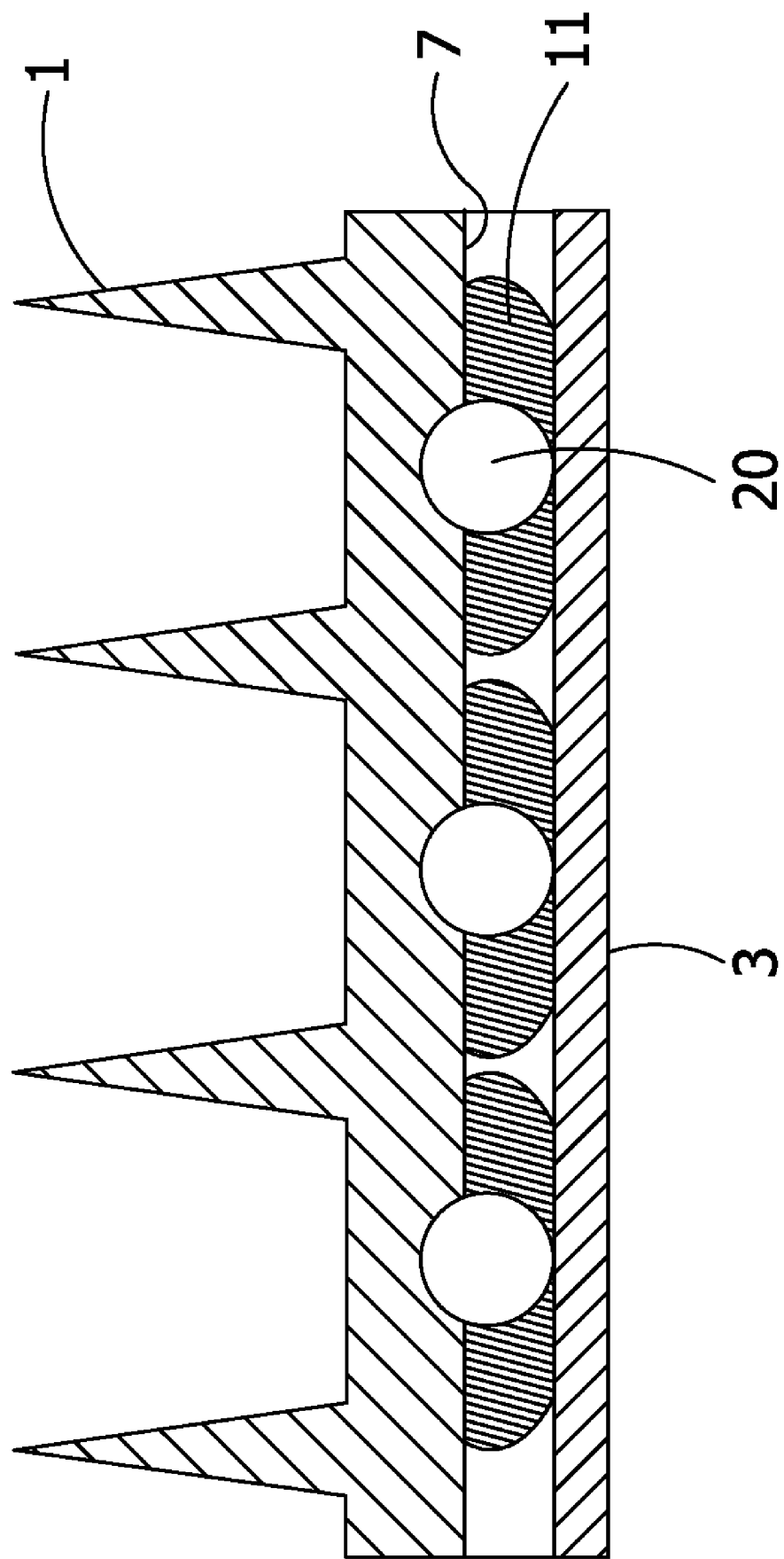
FIG. 3A depicts a side view of a third configuration for the conductive connector attachment of the present disclosure.

As an alternative to using holes in the conductive hook material, the conductive connector attachment can comprise a metal scrim layer to be used with the solder materials described above. Generally, the metal scrim layer 20 is located between the non-contact side 7 of the conductive hook material 1 and the printed circuit board 3 to electrically connect the conductive hook material 1 to the printed circuit board 3 using conventional soldering mechanisms (see FIG. 3A). Specifically, a layer of metal such as aluminum, copper, iron, silver, gold, nickel, zinc, tin, or a combination thereof, is applied between the non-contact side of the conductive hook material and the printed circuit board. The metal scrim layer 20 suitably provides mechanical strength and, can further provide a point of contact for the solder material 11 to flow to during heating and attachment. The metal scrim layer 20 is typically at least about 0.001 inches thick. More suitably, the metal scrim layer 20 has a thickness of from about 0.006 inches to about 0.025 inches.

Figure 3B:
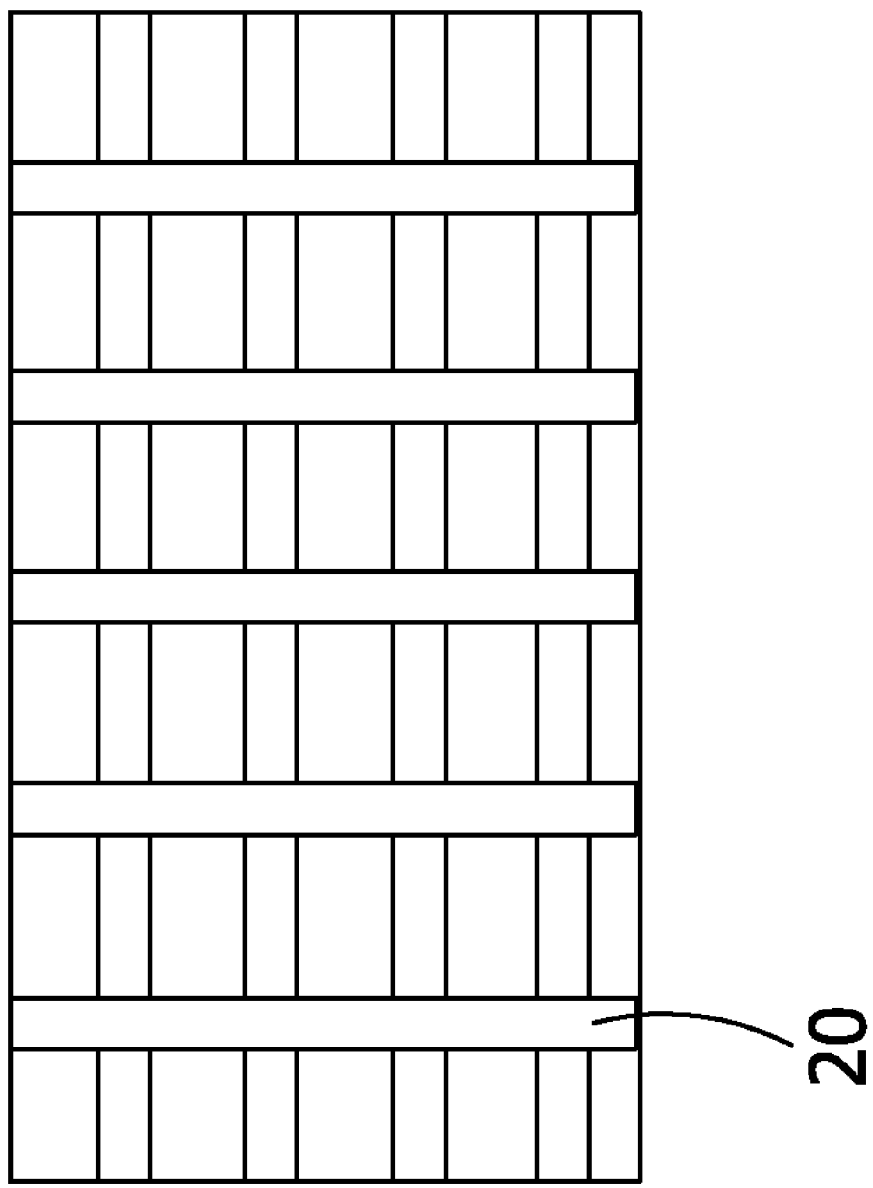
FIG. 3B depicts a bottom view of the configuration for the conductive connector attachment shown in FIG. 3A.

The metal scrim layer 20 can be applied between the conductive hook material 1 and the printed circuit board 3 in any pattern known in the art. For example, in one embodiment, as shown in FIG. 3B, the metal scrim layer 20 is applied in a cross-hatched pattern. In another embodiment, the metal scrim layer is applied in a striped pattern.

In yet another alternative embodiment using the solder material as described above, the conductive connector attachment 100 comprises the conductive hook material 1, the printed circuit board 3, the solder material 5, and the conductive loop material 2. In this embodiment, however, the conductive hook material 1 comprises multiple hooks 30, 32, 34, 36, and 40, 42, 44, 46 on both its non-contact side 7 and its contact side 9, respectively. As the solder material 5 described above is applied to the printed circuit board 3 and the non-contact side of the conductive hook material 1 is placed in the molten solder material during processing, the hooks 30, 32, 34, 36 on the non-contact side 7 melt. Furthermore, by immediately removing the hooks 30, 32, 34, 36 from the heat, the solder material solidifies around the melted portions of the hooks 30, 32, 34, 36, thereby forming a mechanical bond between the hooks 30, 32, 34, 36 of the non-contact side 7 of the conductive hook material 1 and the printed circuit board 3.

In one particularly preferred embodiment, the hooks on the non-contact side of the conductive hook material are strategically shaped into a mushroom-cap shape (not shown) By using a mushroom-cap shape, the hooks melt into a configuration that allows for better bonding with the solder material, and thus, with the printed circuit board. Other suitable shapes for the hooks of the non-contact side can include stem-only mushroom-cap hooks; that is mushroom-shaped hooks having the stems only.

Figure 5A:
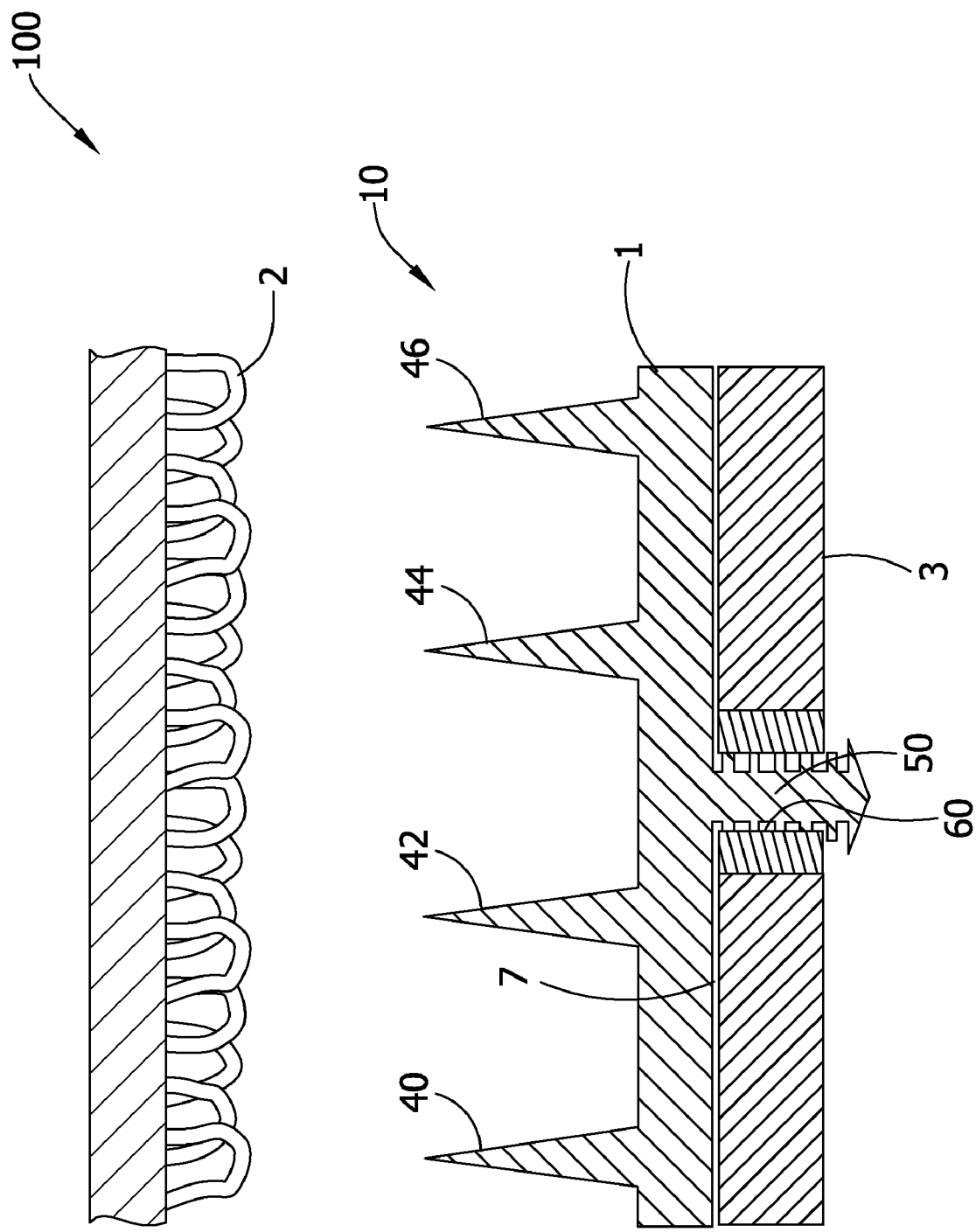
FIG. 5A depicts a side view of a fifth configuration for the conductive connector attachment of the present disclosure.

As an alternative to using a soldering mechanism to bond the conductive hook material to the printed circuit board, a compression fit can be used to produce the conductive connector attachment of the present disclosure. For example, in one embodiment, the conductive connector attachment is produced by bonding a stud attached to the non-contact side of the conductive hook material to the printed circuit board through a via on the printed circuit board. Referring to FIG. 5A, the conductive connector attachment 10 comprises a conductive hook material 1 including a contact side 9 with multiple hooks 40, 42, 44, 46 and an opposing non-contact side 7 comprising at least one stud 50. More suitably, the non-contact side 7 includes multiple studs (not shown). The stud 50 can compression fit into a via 60 located on the printed circuit board 3, thereby connecting the non-contact side 7 of the conductive hook material 1 to the printed circuit board 3.

The studs can be made from any material known in the art. For example, in one embodiment, the studs are made of a metal selected from the group consisting of aluminium, copper, iron, silver, gold, nickel, zinc, tin, and combinations thereof. In another embodiment, the studs can suitably be made from the same thermoplastic material used to make the conductive hook and loop materials, more specifically, polyolefins, nylon, styrene block copolymers, and combinations thereof. Particularly preferred thermoplastic materials for use in making the studs of this embodiment include polyolefins such as polypropylene, polyethylene, and combinations thereof.

Typically, the studs fill the entire length of the via in the printed circuit board. As noted above, the printed circuit board for use in the conductive connector attachment of the present disclosure typically has a thickness of from about 5 millimeters to about 125 millimeters, more suitably, from about 20 millimeters to about 100 millimeters and, even more suitably, from about 30 millimeters to about 65 millimeters. As such, the studs for use in the conductive connector attachment of the present embodiment have a length of from about 5 millimeters to about 125 millimeters. More suitably, the studs are from about 5 millimeters in length to about 100 millimeters in length and, even more suitably, from about 30 millimeters to about 65 millimeters.

Figure 5B:
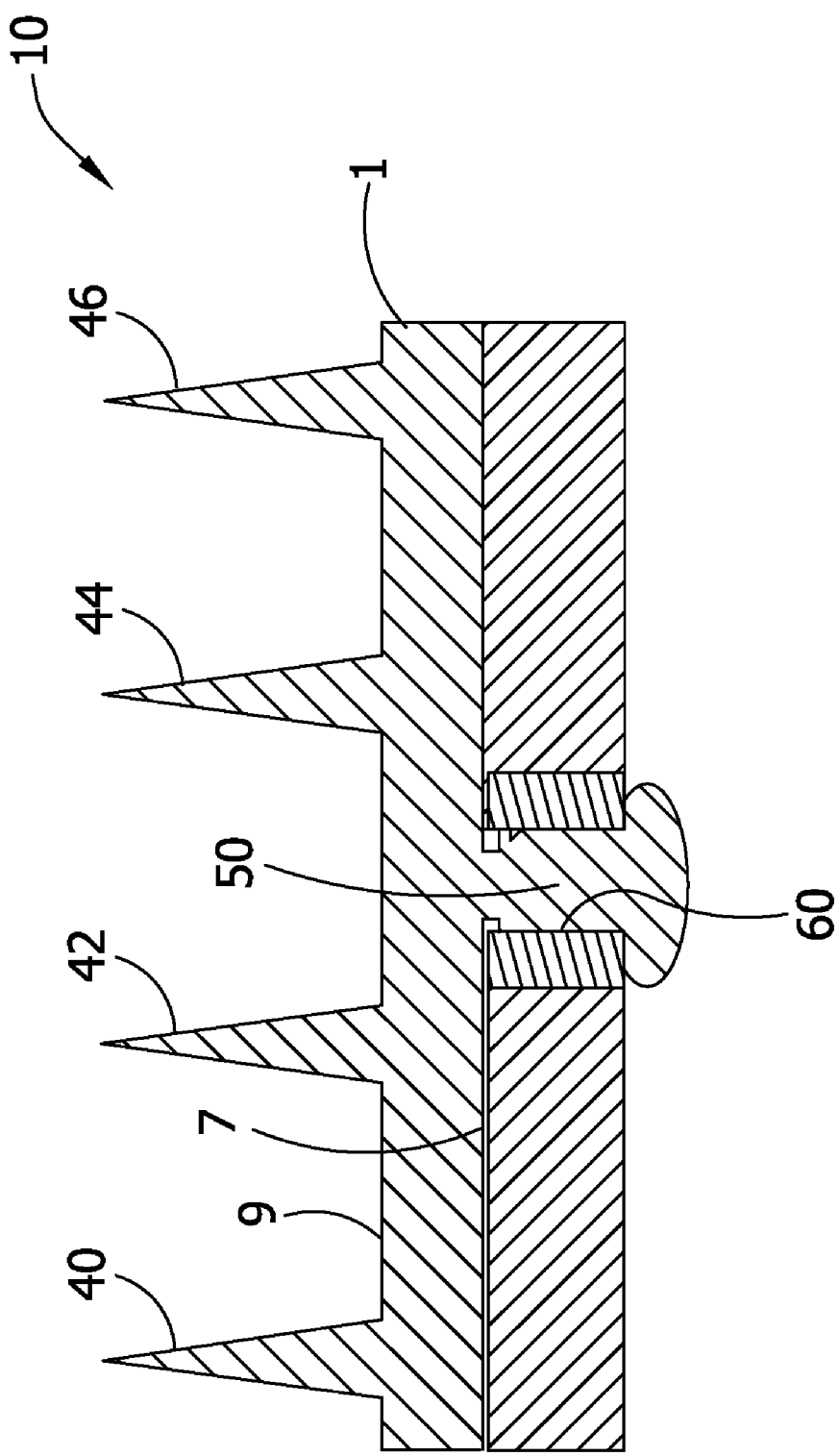
FIG. 5B depicts a side view of the sixth configuration for the conductive connector attachment shown in FIG. 5A.

Additionally, as shown in FIG. 5B, the studs of this embodiment can further be melted as described herein above to provide a better mechanical connection to the printed circuit board. For example, the studs can be secured through compression fit into the vias, and then, heated to melt the thermoplastic material to fill the vias and attach the studs to the opposing side of the printed circuit board.

It should be noted that the studs of this embodiment can be of any shape suitable in the art. Typically, the shape of the stud will vary depending on the shape of the via and the desired end product to be produced.

Figure 5C:
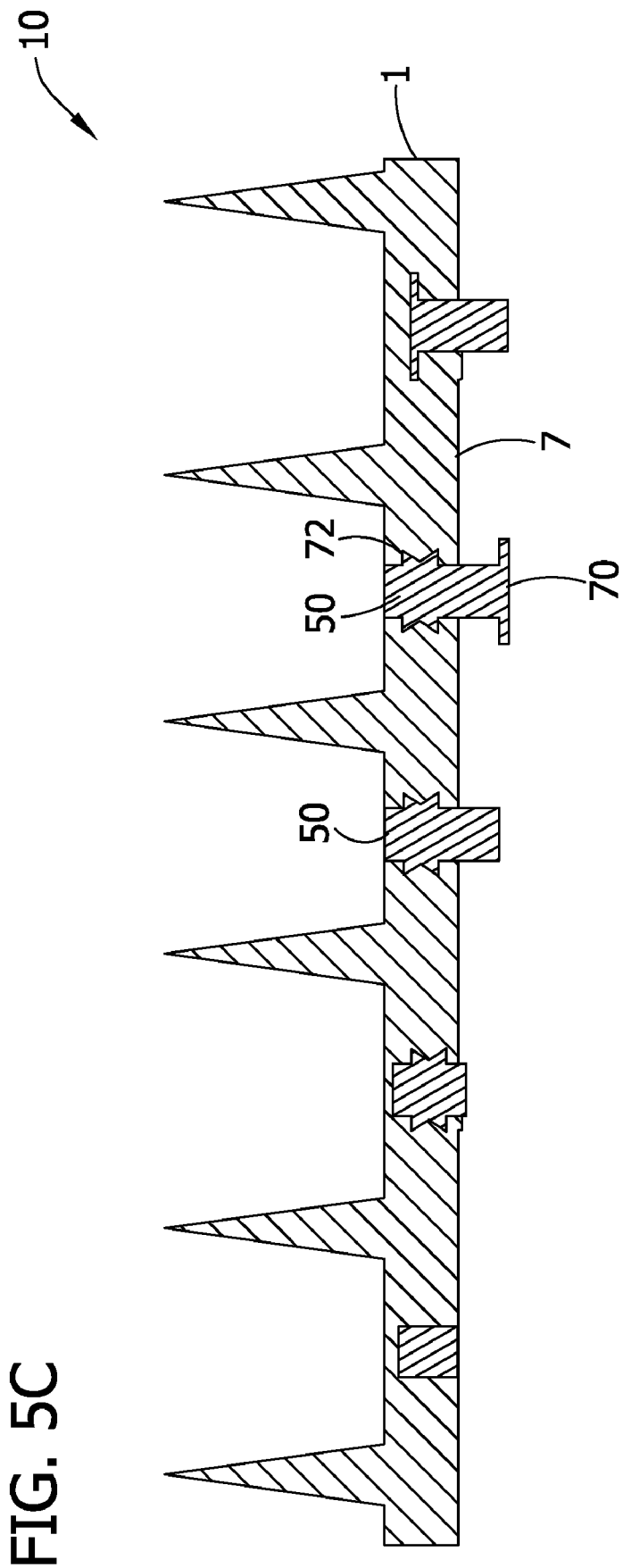
FIG. 5C depicts a side view of a seventh configuration for the conductive connector attachment of the present disclosure.

In one particularly preferred embodiment, as shown in FIG. 5C, the stud 50 further comprises a foot 70 that extends out from the non-contact side 7 of the conductive hook material 1. The foot allows for a stronger mechanical attachment between the conductive hook material and the printed circuit board (not shown).

Typically, the stud comprising the foot can be any shape available to one skilled in the art. Suitably, the stud can be in shapes including round head nail-shaped, flat-top nail-shaped, screw-shaped, cylinder-shaped, hook-shaped, mushroom-cap shaped, tapered cylinder-shaped, and combinations thereof. In one particularly preferred embodiment, the stud is round head nail-shaped where the round head of the nail is directed towards the contact side of the conductive hook material and away from the printed circuit board. In this specific configuration, the thermoplastic conductive hook material is melted and extruded around the head of the nail to create the mechanical and electrical connection between the conductive hook material and the solder material.

Similar to the throughhole in the embodiment described above, the stud can further include at least one or more teeth or barbs 72 that connect to the internal sides of the conductive hook material 1. As noted above, the teeth allow for greater surface area and chance of electrical connection to the conductive hook material.

Optionally, in this embodiment, a solder material (not shown) as described above can be used to more securely attach the conductive hook material to the printed circuit board (not shown) through the stud and via. Specifically, the solder material connects the stud on the non-contact side of the conductive hook material to the via of the printed circuit board. Suitable solder materials are discussed above.

It should be understood by one skilled in the art that while the present disclosure expressly discloses bonding the conductive hook material to the printed circuit board, the present disclosure alternatively recognizes bonding of the conductive loop material to the printed circuit board using the various mechanisms and configurations discussed above.

Having described the disclosure in detail, it will be apparent that modifications and variations are possible without departing from the scope of the disclosure defined in the appended claims.

EXAMPLES

The following non-limiting examples are provided to further illustrate the present disclosure.

Example 1

In this Example, a conductive connector attachment was produced in accordance with one embodiment of the present disclosure and its connection resistance was compared to a control attachment sample.

To produce the conductive connector attachment, round holes (approximately 2 mm to 4 mm) were made into a conductive hook material (commercially available as conductive VELCRO from Velcro USA, Inc., Manchester, N.H.) using needle point. The conductive hook material was then adhered to a one-sixteenth inch thick metal plate using a conductive epoxy, available as a silver two-part epoxy (resin and hardener with suspended silver particles) from Chemtronics, Kennesaw, Ga. Specifically, the surface of the metal plate was roughed up using a steel brush. Then, a few grams of mixed epoxy were placed on an epoxy patch on the conductive hook material. Pressure was applied to allow for the epoxy to push through the holes. The metal plate was then allowed to stand for approximately two hours in order for the epoxy to dry.

A control sample was also produced. The control sample consisted of the conductive hook material without holes adhered to a metal plate using the conductive epoxy described above.

Once produced, the connection resistance of the sample of conductive connector attachment and control attachment sample were measured from the top of the hooks on the conductive hook materials to one inch removed on the metal plate using a Fluke 189 multimeter (commercially available from FLUKE Corporation, Everett, Wash,). The conductive connector attachment including the holes in the conductive hook material showed a connection resistance as measured between the hooks and the metal plate of approximately 500 Ohms. By comparison, the control sample showed a much greater connection resistance, specifically a connection resistance of approximately 1.2 kOhms.

Example 2

In this Example, samples of conductive hook materials were directly soldered to printed circuit boards using conventional soldering mechanisms. Specifically, the samples were produced by melting, at a temperature of approximately 315° C. to 371° C. (600-700° F.) using a Weller soldering iron, the thermoplastic material of the conductive hook materials (commercially available as conductive VELCRO from Velcro USA, Inc., Manchester, N.H.) into a solder material (commercially available as Kester 24-6337-8213 (a 63% tin/37% lead alloy) from Digikey electronics, Thief River Falls, Minn.) and contacting the conductive hook materials to portions of the printed circuit boards (i.e., solder pads, each having a size of approximately 3 mm×7 mm) to create mechanical and electrical connections.

Connection resistance from the top of the hooks of the conductive hook material to the base of the printed circuit board of each sample was measured as in Example 1. Connection resistances were on the order of from about 100 Ohms to about 500 Ohms. While the observed resistances were good, over time the opportunity for the formed cold joints to stress and become poorer electrical connections was found.

Example 3

In this Example, a sample of conductive connector attachment including metal throughholes in the conductive hook material was produced and its connection resistance was tested.

To produce the conductive connector attachment, the female portion of metal button snaps were placed through a conductive hook material (available as conductive VELCRO from Velcro USA, Inc., Manchester, N.H.) to produce a throughhole connection. The solder material, as used in Example 2, was applied to the snap throughhole and to a portion of a printed circuit board (i.e., solder pad, having a size of approximately 3 mm×7 mm). The snap throughhole connector of the conductive hook material was then soldered to the printed circuit board.

Connection resistance from one solder pad on the printed circuit board to one inch removed from the conductive hook material, taken through the snap throughhole of the conductive hook material, was measured as in Examples 1 and 2. Connection resistance was approximately 1 kOhm; however, it was found that the connection resistance decreased as the distance between the snap throughhole and the base of the conductive hook material was reduced. Specifically, the connection resistance decreased to less than 400 Ohms.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the disclosure are achieved and other advantageous results attained.

As various changes could be made in the above conductive connector attachments and configurations without departing from the scope of the invention, it is intended that all matter contained in the above description and shown in the accompanying drawings shall be interpreted as illustrative and not in a limiting sense.

What is claimed is:

1. A conductive connector attachment for a printed circuit board comprising:
    an electrically conductive hook material comprising a contact side and a non-contact side, the contact side comprising multiple hooks and the non-contact side comprising at least one stud, wherein the contact side and the non-contact side are opposing sides, wherein the electrically conductive hook material further comprises vapor deposited metal on its surface; and wherein the thickness of the vapor deposited metal is from about 20 angstroms to about 800 angstroms;
    a printed circuit board comprising at least one via, wherein the stud is compatible with the via thereby electrically connecting the printed circuit board to the non-contact side of the electrically conductive hook material; and
    an electrically conductive loop material that is compatible with the contact side of the electrically conductive hook material.

2. The conductive connector attachment as set forth in claim 1 wherein the non-contact side of the electrically conductive hook material comprises multiple studs.

3. The conductive connector attachment as set forth in claim 2 wherein the studs comprise a metal selected from the group consisting of aluminum, copper, iron, silver, gold, nickel, zinc, tin, and combinations thereof.

4. The conductive connector attachment as set forth in claim 1 wherein the electrically conductive loop material comprises vapor deposited metal on its surface.

* * * * *